(12) United States Patent
Ishikawa et al.

(10) Patent No.: US 10,049,791 B2
(45) Date of Patent: Aug. 14, 2018

(54) DIFFERENTIAL TRANSMISSION CABLE AND MULTIPAIR DIFFERENTIAL TRANSMISSION CABLE

(71) Applicant: Hitachi Metals, Ltd., Tokyo (JP)

(72) Inventors: Hiroshi Ishikawa, Hitachi (JP); Takahiro Sugiyama, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 15/277,350

(22) Filed: Sep. 27, 2016

(65) Prior Publication Data

US 2017/0207006 A1    Jul. 20, 2017

(30) Foreign Application Priority Data

Jan. 20, 2016  (JP) .................. 2016-008952

(51) Int. Cl.
| | | |
|---|---|---|
| H01B 11/00 | (2006.01) |
| H01B 7/02 | (2006.01) |
| H01B 7/22 | (2006.01) |
| H01P 3/06 | (2006.01) |
| H05K 9/00 | (2006.01) |
| H01B 11/20 | (2006.01) |
| H01B 11/18 | (2006.01) |

(52) U.S. Cl.
CPC .......... *H01B 11/002* (2013.01); *H01B 7/025* (2013.01); *H01B 7/226* (2013.01); *H01P 3/06* (2013.01); *H05K 9/0084* (2013.01); *H05K 9/0098* (2013.01); *H01B 11/183* (2013.01); *H01B 11/20* (2013.01)

(58) Field of Classification Search
CPC ...... H01B 11/002; H01B 7/025; H01B 7/226; H01B 11/20; H01B 3/10; H01B 3/105; H01B 11/1025; H01B 11/183; H01B 7/62; H01B 7/64; H01P 3/06; H05K 9/0084
USPC .......................................................... 174/34
See application file for complete search history.

(56) References Cited

U.S. PATENT DOCUMENTS

| | | | | |
|---|---|---|---|---|
| 3,049,584 A * | 8/1962 | Ascoli | ...................... | H01B 1/20 174/106 SC |
| 3,551,586 A * | 12/1970 | Dembiak | ............... | H01B 9/022 174/107 |
| 5,216,202 A * | 6/1993 | Yoshida | ................. | H01B 7/182 174/106 R |
| 6,010,788 A * | 1/2000 | Kebabjian | ............ | H01B 11/002 174/102 R |
| 6,235,385 B1 * | 5/2001 | Lee | ...................... | H05K 9/0067 428/344 |
| 6,255,594 B1 * | 7/2001 | Hudson | .................. | H01B 7/295 174/121 A |
| 6,452,107 B1 * | 9/2002 | Kebabjian | ............ | H01B 11/002 174/113 R |
| 2003/0150633 A1* | 8/2003 | Hirakawa | ............ | H01B 11/002 174/36 |

(Continued)

*Primary Examiner* — William H Mayo, III
*Assistant Examiner* — Rhadames J Alonzo Miller
(74) *Attorney, Agent, or Firm* — Roberts Mlotkowski Safran Cole & Calderon P.C.

(57) ABSTRACT

A differential transmission cable includes a pair of signal lines, an insulation covering the pair of signal lines, and a shielding tape helically wound around the insulation. The shielding tape includes a conductor and an insulation layer that is formed on one surface of the conductor and that has a thickness of not less than 10 nm and less than 1 μm.

8 Claims, 6 Drawing Sheets

(56) References Cited

U.S. PATENT DOCUMENTS

| | | | |
|---|---|---|---|
| 2006/0151195 A1* | 7/2006 | Donazzi | H01B 9/02 174/11 OR |
| 2007/0173151 A1* | 7/2007 | Kapitza | H01B 1/20 442/149 |
| 2008/0314613 A1* | 12/2008 | Huang | H01B 7/04 174/107 |
| 2010/0032188 A1* | 2/2010 | Meier | H01B 17/50 174/140 C |
| 2011/0247856 A1 | 10/2011 | Matsuda et al. | |
| 2013/0056258 A1* | 3/2013 | Zhang | C09J 7/29 174/388 |
| 2015/0340127 A1* | 11/2015 | Huang | H01B 7/2806 174/74 R |
| 2016/0314873 A1* | 10/2016 | Hayashishita | H01B 1/023 |

* cited by examiner

DIFFERENTIAL TRANSMISSION CABLE AND MULTIPAIR DIFFERENTIAL TRANSMISSION CABLE

The present application is based on Japanese patent application No. 2016-008952 filed on Jan. 20, 2016, the entire contents of which are incorporated herein by reference.

BACKGROUND OF THE INVENTION

1. Field of the Invention

The invention relates to a differential transmission cable and a multipair differential transmission cable which are used for transmitting differential signals.

2. Description of the Related Art

A differential transmission cable is known in which a shielding metal foil/resin tape is helically applied (or spirally wrapped) (see e.g. JP-A-2011-222262) or is longitudinally wrapped (see e.g. JP-A-2003-234025) around a pair of signal lines.

To prevent a phenomenon called suck-out (i.e., significant signal attenuation) which occurs when using a helically-applied metal foil/resin tape composed of a resin tape and a foil of metal such as copper laminated thereon, the differential transmission cable described in JP-A-2011-222262 is configured that one of edges of the metal foil/resin tape is folded outward so that the metal foil is electrically in contact with itself at an overlap portion of the metal foil/resin tape.

In the differential transmission cable described in JP-A-2003-234025, a conductor is formed to have a thickness of not less than 1 μm and not more than 10 μm so that deterioration in conductor resistance due to eddy current induced in the metal foil/resin tape and resulting signal deterioration are suppressed.

SUMMARY OF THE INVENTION

Differential transmission cables for transmitting differential signals are required so that differential-mode loss (an absolute value of Sdd21) and differential-to-common mode conversion (Scd21) are sufficiently small in a specific frequency range which is determined by data transmission speed (baud rate).

The differential-mode loss (the absolute value of Sdd21) is a parameter determining signal energy loss and the level of signal distortion, and is mainly caused by loss in a material constituting a cable (conductor loss, dielectric loss) and excess loss resulting from the shielding method. It is known that loss resulting from the shielding method is different depending on the shield structure. For example, it is known that excess loss in longitudinally wrapped shields is low but excess loss in spiral shields is high at a specific frequency (a suck-out in spiral shield).

To increase differential mode bandwidth, the excess loss in the shield within an operating frequency range is preferably reduced. To reduce the excess loss, it is desirable to prevent a suck-out in the spiral shield from occurring within an operating frequency range.

Meanwhile, the differential-to-common mode conversion (Scd21) is a parameter determining signal energy loss and the level of noise contamination, and is mainly caused by asymmetric electrical characteristics of two cores and an insulating material provided around the cores. The asymmetric electrical characteristics of two cores occur during the production process and are also caused by sharply bending a cable or by long-term use in a harsh environment.

Generated common-mode signals (noise signals) attenuate when the excess loss occurs in the shield. Therefore, it is possible to reduce the differential-to-common mode conversion (Scd21) by increasing the excess loss in the shield even when the electrical characteristics of two cores are asymmetric. That is, increasing the excess loss in the shield allows the differential-to-common mode conversion (Scd21) to be reduced and also can increase robustness (strength) to cope with deformation or environmental changes.

Thus, there are the following conflicting demands for the excess loss in the shield.

(1) The differential-mode loss (the absolute value of Sdd21) within the operating frequency range needs to be reduced to increase differential mode bandwidth, and it is therefore desirable to reduce the excess loss in the shield. In other words, any suck-out preferably does not occur.

(2) The excess loss in the shield is desirably increased to reduce the differential-to-common mode conversion (Scd21) and to increase robustness. In other words, a suck-out preferably occurs.

Accordingly, a shield structure without differential-mode loss suck-out and with common-mode loss suck-out, if realized, can satisfy both the requirements (1) and (2).

However, any shield structures having such characteristics have not been known so far, such that the spiral shield in JP-A-2011-222262 has a problem of narrow differential mode bandwidth and the longitudinally-wrapped shield in JP-A-2003-234025 has a problem of lack of robustness even though the differential mode bandwidth is wide.

As such, in the conventional techniques, a longitudinally-wrapped shield needs to be adopted to increase the differential mode bandwidth particularly in case of manufacturing differential transmission cables used for high-speed transmission of more than 25 Gbaud and, even when the longitudinally-wrapped shield is adopted, it is necessary to further adopt a core structure particularly excellent in symmetry, such as a two cores-in-one insulation structure, to realize high robustness.

It is an object of the invention to provide a differential transmission cable and a multipair differential transmission cable that have the electrical characteristics that a suck-out in an operating frequency range of not less than 100 MHz and not more than 20 GHz occurs in common-mode loss but is suppressed in differential-mode loss.

(1) According to an embodiment of the invention, a differential transmission cable comprising:

a pair of signal lines;

an insulation covering the pair of signal lines; and a shielding tape helically wound around the insulation, wherein the shielding tape comprises a conductor and an insulation layer that is formed on one surface of the conductor and that has a thickness of not less than 10 nm and less than 1 μm.

(2) According to another embodiment of the invention, a multipair differential transmission cable comprises a plurality of the differential transmission cables according to the above embodiment (1), wherein the plurality of the differential transmission cables are collectively shielded.

Effects of the Invention

According to an embodiment of the invention, a differential transmission cable and a multipair differential transmission cable can be provided that have the electrical characteristics that a suck-out in an operating frequency range of not less than 100 MHz and not more than 20 GHz occurs in common-mode loss but is suppressed in differential-mode loss.

BRIEF DESCRIPTION OF THE DRAWINGS

Next, the present invention will be explained in more detail in conjunction with appended drawings, wherein:

FIGS. 4A and 4B show an example of thickness measurement result of an oxide film in a copper foil, wherein FIG. 4A is the entire graph and FIG. 4B is a partial enlarged view of FIG. 4A;

FIGS. 5A to 5C are diagrams illustrating the results of electrical characteristic measurement on test samples of the differential transmission cable in Example, wherein FIG. 5A shows the measurement result of differential-mode loss (Sdd21), FIG. 5B shows the measurement result of common-mode loss (Scc21) and FIG. 5C shows the measurement result of differential-to-common mode conversion (Scd21); and FIGS. 6A to 6C are diagrams illustrating the results of electrical characteristic measurement on test samples of the differential transmission cable in Comparative Example, wherein FIG. 6A shows the measurement result of differential-mode loss (Sdd21), FIG. 6B shows the measurement result of common-mode loss (Scc21) and FIG. 6C shows the measurement result of differential-to-common mode conversion (Scd21).

DETAILED DESCRIPTION OF THE PREFERRED EMBODIMENTS

Embodiment

Figure 1:
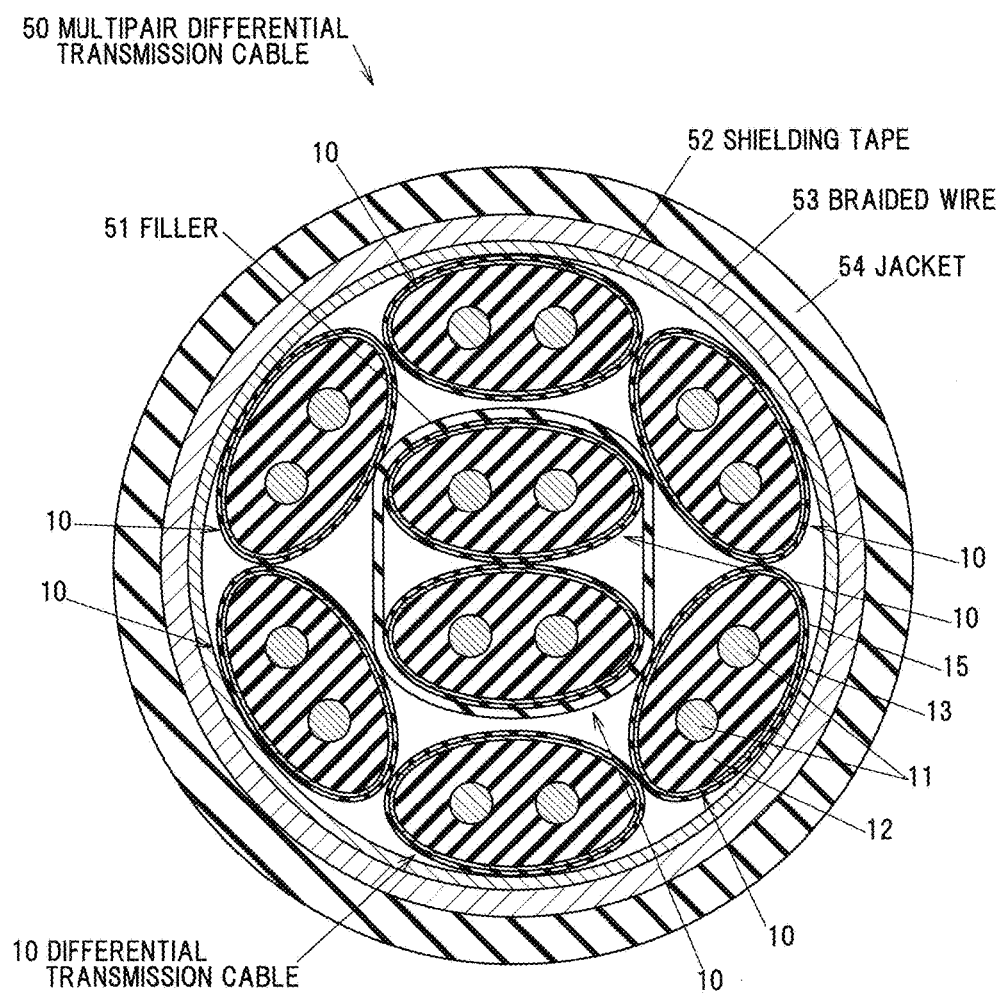
FIG. 1 is a schematic cross sectional view showing a configuration example of a multipair differential transmission cable in an embodiment of the present invention.

FIG. 1 is a schematic cross sectional view showing a configuration example of a multipair differential transmission cable in an embodiment of the invention.

A multipair differential transmission cable 50 has plural bundled differential transmission cables 10, a shielding tape 52 wound around the plural differential transmission cables 10, a braided wire 53 covering the shielding tape 52, and a jacket 54 covering the braided wire 53. The plural differential transmission cables 10 are shielded together by the shielding tape 52 and the braided wire 53.

The number of the differential transmission cables 10 is eight in the example shown in FIG. 1 but is not specifically limited, and may be, e.g., two, eight, or twenty-four, etc. In the example shown in FIG. 1, two differential transmission cables 10 are arranged in the center in the cross section of the multipair differential transmission cable 50, and six differential transmission cables 10 are arranged at substantially equal intervals around the two differential transmission cables 10 via a filler 51.

Materials used to form general cables can be used to form the shielding tape 52, the braided wire 53 and the jacket 54. The filler 51 is formed of, e.g., paper, yarn or foam. The foam is, e.g., polyolefin foam such as polypropylene foam or ethylene foam.

Figure 2:
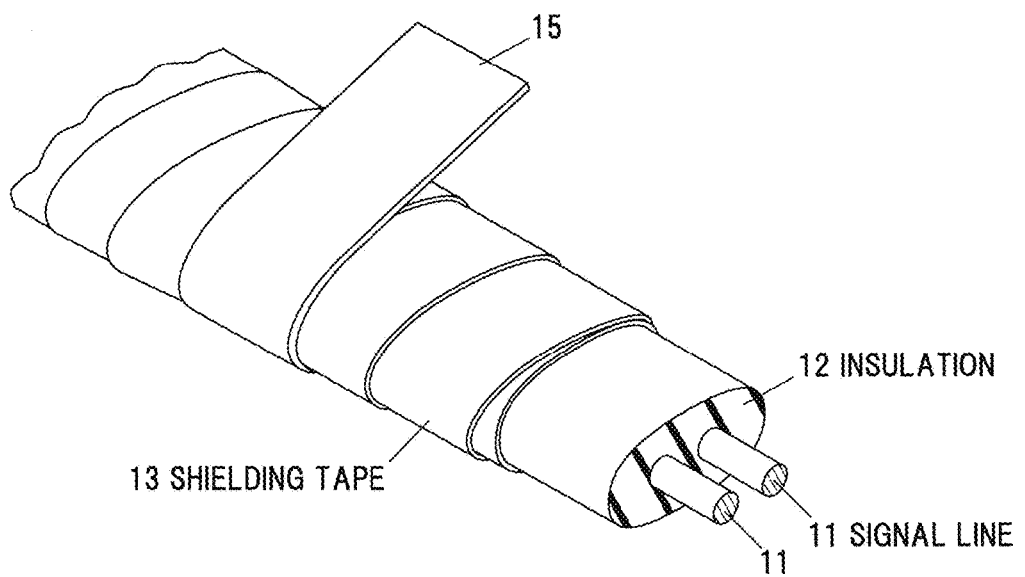
FIG. 2 is a schematic perspective view showing a configuration example of a differential transmission cable in the embodiment of the invention.

FIG. 2 is a schematic perspective view showing a configuration example of the differential transmission cable 10 in the embodiment of the invention.

The differential transmission cable 10 has a pair of signal lines 11, an insulation 12 covering the pair of signal lines 11, a shielding tape 13 helically wound around the insulation 12, and an outer-layer tape 15 helically wound around the shielding tape 13 and covering the shielding tape 13.

The pair of signal lines 11 are conductor wires formed of copper, etc., and transmit differential signals. The pair of signal lines 11 may be covered with a single insulation 12 as shown in FIG. 2 or may be individually covered with separate insulations 12.

The insulation 12 is formed of an insulating material such as polyethylene, polytetrafluoroethylene (PTFE) or tetrafluoroethylene-hexafluoropropylene copolymer (FEP), etc. A foamed insulating material such as polyethylene foam can be also used as the insulation 12.

Figure 3:
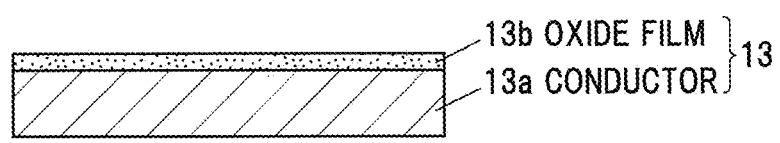
FIG. 3 is a cross sectional view showing a shielding tape.

FIG. 3 is a cross sectional view showing the shielding tape 13. The shielding tape 13 has a strip-shaped conductor 13a and an oxide film 13b. The shielding tape 13 is formed using, e.g., a strip-shaped conductive metal foil such as copper foil or aluminum foil and the oxide film 13b is formed by oxidizing one surface of the metal foil. The non-oxidized portion of the metal foil is the conductor 13a.

The shielding tape 13, with the oxide film 13b facing in and the conductor 13a facing out, is wound around the insulation 12 to facilitate connection of the conductor 13a to a ground of a circuit board at the time of connecting the differential transmission cable 10 to a connector, etc., provided on the circuit board. Meanwhile, when the differential transmission cable 10 has a drain wire inside the shielding tape 13, the shielding tape 13 is wound with the conductor 13a facing in. The oxide film 13b is an example of the insulation layer of the invention.

The thickness of the oxide film 13b is not less than 10 nm and less than 1 µm. Differential-mode loss suck-out does not occur when the oxide film 13b has a thickness of less than 1 µm, common-mode loss suck-out does not occur when the oxide film 13b has a thickness of less than 10 nm, and only common-mode loss suck-out occurs when the oxide film 13b has a thickness of not less than 10 nm and less than 200 nm. Therefore, a shield without differential-mode loss suck-out and with common-mode loss suck-out can be realized by adjusting the thickness of the oxide film 13b to not less than 10 nm and less than 1 µm. The thickness of the oxide film 13b is more desirably in a range of not less than 10 nm and less than 200 nm.

The outer-layer tape 15 is formed of a strip-shaped flexible member and has a laminated structure composed of, e.g., a flexible insulating resin layer such as PET (polyethylene terephthalate) and an adhesive layer containing an adhesive agent. The outer-layer tape 15, with the adhesive layer facing in and the resin layer facing out, is helically wound around the shielding tape 13. It is possible to prevent separation of the shielding tape 13 from the insulation 12 by winding the outer-layer tape 15.

Functions and Effects of the Embodiment

In the present embodiment, even when asymmetric electrical characteristics of two signal lines 11 and the material of the insulation 12 surrounding the signal lines 11 occur during manufacturing of cable or at the time of bending the cable, an increase in differential-to-common mode conversion due to the asymmetry can be suppressed by increasing common-mode loss using spiral winding of the shielding tape, and this provides wide differential mode bandwidth and also allows electrical characteristics to be more robust than a conventional technique in which the insulation layer of the shielding tape is not less than 1 μm in thickness. In other words, it is possible to provide such electrical characteristics that a suck-out within an operating frequency range of not less than 100 MHz and not more than 20 GHz occurs in common-mode loss but does not occur in differential-mode loss. In addition, such electrical characteristics become prominent when the oxide film 13b has a thickness of not less than 10 nm and less than 200 nm.

In addition, since the differential-to-common mode conversion (Scd21) is less likely to deteriorate even when the cable is bent sharply, it is suitable for a flat cable, a backplane and a wiring board, etc. Furthermore, environmental tolerance of the cable is enhanced, allowing environmental tolerance of system to be improved.

Example

Figure 4A:
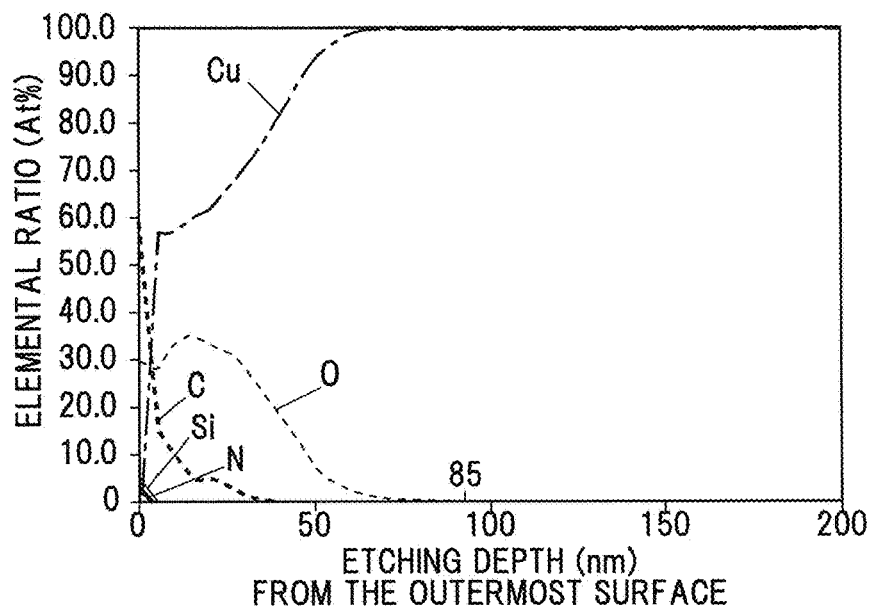
Figure 4B:
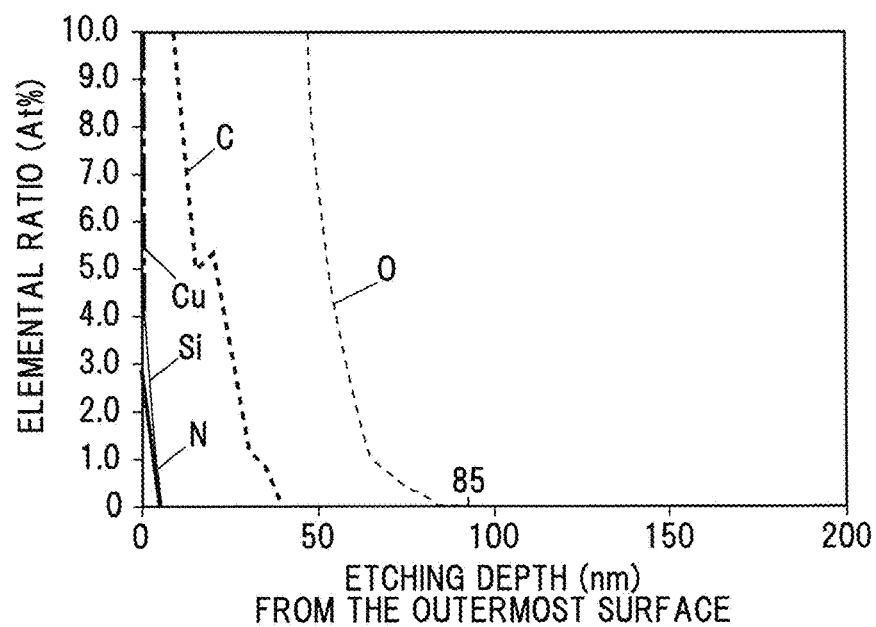

FIGS. 4A and 4B show an example of thickness measurement result of the oxide film 13B formed on a copper foil constituting the shielding tape 13, wherein FIG. 4A is the entire graph and FIG. 4B is a partial enlarged view of FIG. 4A. The vertical axis indicates an elemental ratio (unit: At %), and the horizontal axis indicates an etching depth (unit: nm) from the outermost surface. The vertical axis in FIG. 4A shows from 0 to 100 At % and the vertical axis in FIG. 4B shows from 0 to 10 At %.

An elemental ratio in the oxide film 13b of the shielding tape 13 was measured from the surface by XPS (X-ray photoelectron spectroscopy) while scraping the surface at every 5 nm step by Ar+ ion etching. When the etching depth from the outermost surface at which the element ratio of oxygen O obtained by XPS is 0 At % is defined as the oxide film thickness, the thickness of the oxide film 13b in FIGS. 4A and 4B is 85 nm.

Figure 5A:
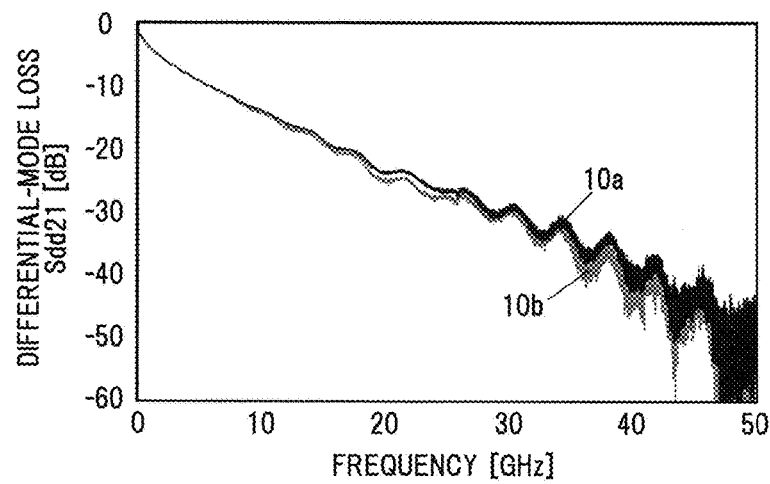
Figure 5B:
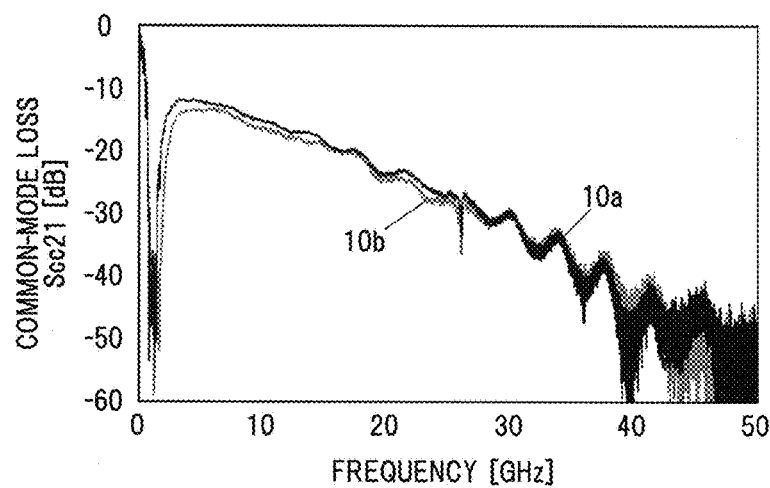
Figure 5C:
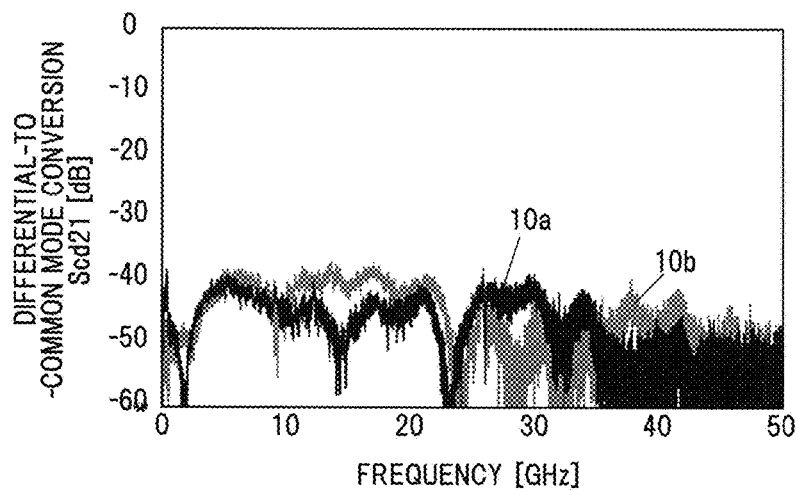

FIGS. 5A to 5C are diagrams illustrating the results of electrical characteristic measurement on test samples of the differential transmission cable in Example, wherein FIG. 5A shows the measurement result of differential-mode loss (Sdd21), FIG. 5B shows the measurement result of common-mode loss (Scc21) and FIG. 5C shows the measurement result of differential-to-common mode conversion (Scd21).

For the measurement, a 8 μm-thick copper foil was used as the shielding tape 13 and the oxide film 13b having a thickness of 85 nm was formed on the surface. The shielding tape 13 was helically wound around the insulation 12 covering the two signal lines 11, and two test samples 10a and 10b were made as Example.

Figure 6A:
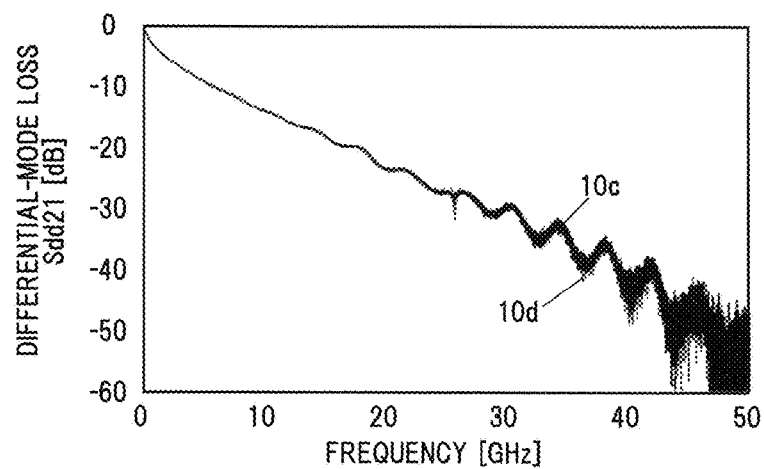
Figure 6B:
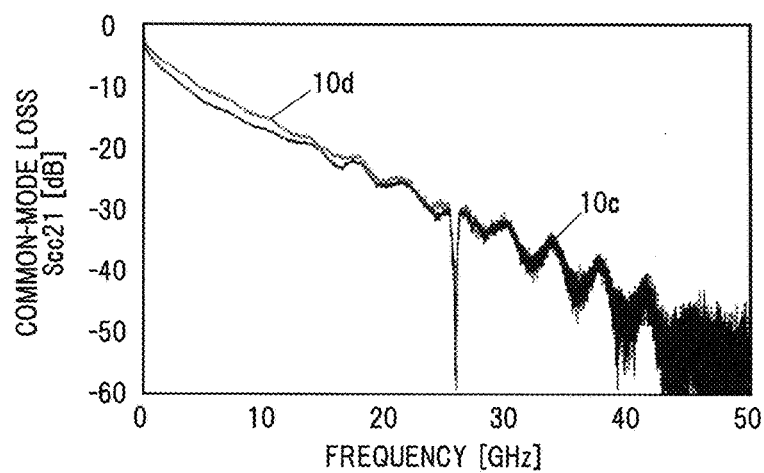
Figure 6C:
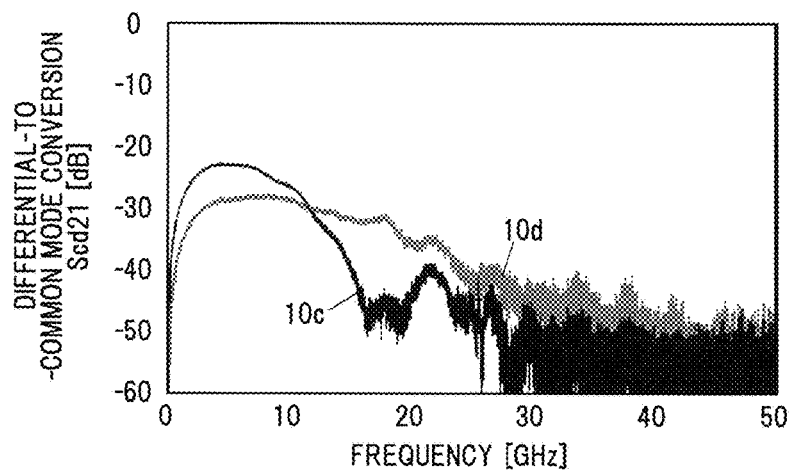

FIGS. 6A to 6C are diagrams illustrating the results of electrical characteristic measurement on test samples of the differential transmission cable in Comparative Example, wherein FIG. 6A shows the measurement result of differential-mode loss (Sdd21), FIG. 6B shows the measurement result of common-mode loss (Scc21) and FIG. 6C shows the measurement result of differential-to-common mode conversion (Scd21).

For the measurement, a copper foil having the same thickness as that in Example was used as a shielding tape and the oxide film 13b was not formed on the surface. The shielding tape was helically wound the around the insulation 12 covering the two signal lines 11, and two test samples 10c and 10c were made as Comparative Example.

As understood from FIGS. 5A and 6A, there was no significant difference in differential-mode loss between FIG. 5A (Example) and Comparative Example (FIG. 6A). In comparison between common-mode loss in Example and that in Comparative Example, suck-out occurred at around 25 GHz in Comparative Example and at around 1 GHz in Example, which means that suck-out in Example occurred within an operating frequency range of 100 MHz to 20 GHz. In comparison between differential-to-common mode conversion in Example and that in Comparative Example, the differential-to-common mode conversion of −22 to −26 dB in Comparative Example was significantly improved to −37 to −38 dB in Example.

Since an increase in differential-mode loss is not observed at all in the test data when the oxide film 13b as the insulation layer has a thickness of 85 nm as shown in FIG. 5, it is presumed that differential suck-out does not occur up to two digits in terms of contact resistance and about twice or three times of 85 nm in terms of the thickness of the insulation layer. Therefore, based on the test data when using the 85 nm-thick insulation layer, it can be expected that differential-mode loss suck-out does not occur in a range of not less than 10 nm and less than 200 nm. Also, when the thickness of the oxide film 13b is in a range of not less than 10 nm and less than 1 μm, it can be expected that higher robustness to cope with deformation or environmental changes than Comparative Example can be obtained while reducing the differential-to-common mode conversion.

The invention are not limited to the embodiment described above and various embodiments can be implemented. For example, the following modifications can be made.

MODIFICATIONS

The shielding tape 13 may be configured that, e.g., a resin film of polyester, etc., having a thickness of not less than 10 nm and less than 200 nm is used as the insulation layer and is attached to the conductor 13a. Alternatively, the shielding tape 13 may be formed by, e.g., applying a resin insulation coating having a thickness of not less than 10 nm and less than 200 nm to a surface of a copper foil tape as a strip-shaped metal foil formed of copper.

What is claimed is:

1. A differential transmission cable, comprising:
a pair of signal lines;
an insulation covering the pair of signal lines; and
a shielding tape helically wound around the insulation, wherein the shielding tape comprises a conductor and an insulation layer formed on one surface of the conductor, the insulation layer having a thickness of not less than 10 nm and less than 1 μm,
wherein a suck-out within an operating frequency range of not less than 100 MHz and not more than 20 GHz occurs in common-mode loss but does not occur in differential-mode loss.

2. The differential transmission cable according to claim 1, wherein the insulation layer of the shielding tape has a thickness of not less than 10 nm and less than 200 nm.

3. The differential transmission cable according to claim 1, wherein the insulation layer comprises an oxide film formed on the one surface of the conductor.

4. The differential transmission cable according to claim 2, wherein the insulation layer comprises an oxide film formed on the one surface of the conductor.

5. A multipair differential transmission cable, comprising a plurality of the differential transmission cables according to claim 1, wherein the plurality of the differential transmission cables are collectively shielded.

6. A multipair differential transmission cable, comprising a plurality of the differential transmission cables according to claim 2, wherein the plurality of the differential transmission cables are collectively shielded.

7. A multipair differential transmission cable, comprising a plurality of the differential transmission cables according to claim 3, wherein the plurality of the differential transmission cables are collectively shielded.

8. A multipair differential transmission cable, comprising a plurality of the differential transmission cables according to claim 4, wherein the plurality of the differential transmission cables are collectively shielded.

* * * * *